United States Patent [19]
Gardner et al.

[11] Patent Number: 6,057,584
[45] Date of Patent: May 2, 2000

[54] SEMICONDUCTOR DEVICE HAVING A TRI-LAYER GATE INSULATING DIELECTRIC

[75] Inventors: Mark I. Gardner, Cedar Creek; Mark C. Gilmer, Austin; H. Jim Fulford, Austin; Jack C. Lee, Austin, all of Tex.

[73] Assignee: Advanced Micro Devices, Inc., Sunnyvale, Calif.

[21] Appl. No.: 08/994,302

[22] Filed: Dec. 19, 1997

[51] Int. Cl.$^7$ ...................................... H01L 29/78
[52] U.S. Cl. ........................... 257/411; 257/295; 257/310
[58] Field of Search ..................... 257/410, 411, 257/295, 639, 640, 649; 438/216, 261, 287, 591

[56] References Cited

U.S. PATENT DOCUMENTS 5,572,052  11/1996  Kashihara et al. ..................... 257/295
5,834,353  11/1998  Wu ........................................... 438/287
5,963,810  10/1999  Gardner et al. ......................... 438/287

OTHER PUBLICATIONS

U.S. application No. 08/920,384, filed Aug. 29, 1997.
U.S. application No. 08/993,414, filed Dec. 18, 1997.

*Primary Examiner*—David Hardy

[57] ABSTRACT

A semiconductor device having a gate insulating tri-layer includes a substrate, a nitrogen-containing layer disposed on the substrate, a first dielectric layer disposed over the nitrogen containing layer, a second dielectric layer disposed over the first dielectric layer, and a gate electrode disposed over the second dielectric layer. One of the first and second dielectric layers is formed using an oxide having a dielectric constant ranging from 4 to 100 and the other of the first and second dielectric layers is formed using an oxide having a higher dielectric constant ranging from 10 to 10,000.

22 Claims, 8 Drawing Sheets

SEMICONDUCTOR DEVICE HAVING A TRI-LAYER GATE INSULATING DIELECTRIC

FIELD OF THE INVENTION

The present invention is, in general, directed to a semiconductor device and a method of manufacture thereof. More particularly, the present invention relates to a semiconductor device having a tri-layer dielectric for insulation of a gate electrode and a method of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

Figure 1:
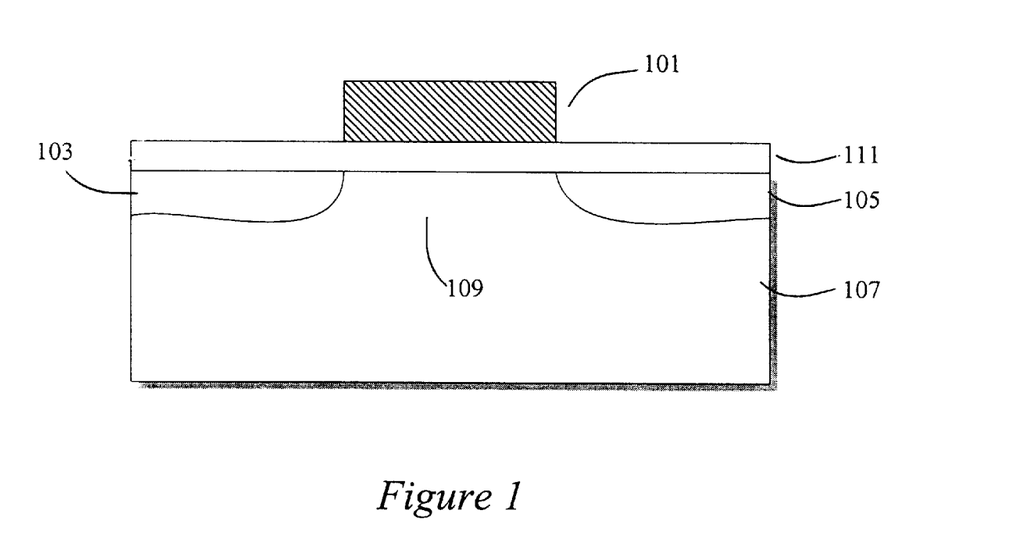
FIG. 1 illustrates components of a MOS semiconductor device.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by a gate insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistor (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate insulating layer. The gate insulating layer is typically formed by growing an oxide, typically $SiO_2$, over the surface of the substrate 101. It is important to carefully control the growth of the gate oxide layer because the thickness and uniformity of the gate oxide layer can significantly impact the overall operation of the device being formed. For example, the drive current in a MOS transistor is inversely proportional to the gate oxide thickness at a given set of terminal voltages. Accordingly, it is normally desired to increase the drive current of the transistor by making the gate oxide as thin as possible, taking into consideration the oxide breakdown and reliability considerations of the process and technology being used.

The above described conventional techniques for forming gate insulating layers impose limitations on the minimum thickness of the gate oxide layer. As the thresholds for minimum thickness are reached, the ability to further increase semiconductor device performance is hindered.

SUMMARY OF THE INVENTION

Generally, the present invention relates to a method and device which provide a gate insulating tri-layer made using a high permittivity oxide material. One embodiment is a method for forming a semiconductor device. A nitrogen-containing layer is formed on a substrate, a first dielectric layer is formed over the nitrogen-containing layer, and a second dielectric layer is formed over the first dielectric layer. One of the first and second dielectric layers is formed from an oxide having a dielectric constant ranging from 4 to 100 and the other of the first and second dielectric layers is formed from an oxide having a higher dielectric constant ranging from 10 to 10,000. Finally, at least one gate electrode is formed over the second dielectric layer.

Another embodiment is a semiconductor device which includes a substrate, a nitrogen-containing layer disposed on the substrate, a first dielectric layer disposed over the nitrogen containing layer, a second dielectric layer disposed over the first dielectric layer, and a gate electrode disposed over the second dielectric layer. One of the first and second dielectric layers is formed from an oxide having a dielectric constant ranging from 4 to 100 and the other of the first and second dielectric layers is formed from an oxide having a higher dielectric constant ranging from 10 to 10,000.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices which have a gate electrode disposed on a gate insulating layer. The invention has been found to be particularly advantageous in application environments where it may be desirable to form a gate insulating layer from a high permittivity material. While the present invention is not so limited, an appreciation of various aspects of the invention is gained through a discussion of various application examples of processes used to form such semiconductor devices.

Generally, the exemplary processes discussed below illustrate a variety of techniques for forming a semiconductor device having a gate insulating tri-layer which includes a high permittivity oxide material. The dielectric constant (i.e., permittivity) of the high permittivity oxide material varies depending on which material is used and is at least 10 (i.e., about 2.5 times the dielectric constant of silicon dioxide—which has a dielectric constant of about 4.2) and generally ranges from 10 to 10,000 (or about 2.5 to 2500 times the dielectric constant of $SiO_2$). In some embodiments, the dielectric constant of the high permittivity oxide material ranges from 20 to 200.

An intermediate permittivity material is also typically used. The dielectric constant of this intermediate permittivity oxide material typically ranges from about 4 to 100 (or about 1 to 25 times the dielectric constant of $SiO_2$). In some embodiments, the intermediate permittivity oxide material ranges from 10 to 100. Because the ranges of the high permittivity oxide material and the intermediate permittivity oxide material overlap, the high permittivity oxide material is considered to be the oxide material with the largest dielectric constant.

The use of a high permittivity oxide material for a gate insulating layer provides a number of advantages, details of which are discussed in U.S. patent application Ser. No. 08/920,384, entitled "Semiconductor Device having High Permittivity Gate Insulating Layer and Method of Manufacture Thereof", Attorney Docket No. 11729.132US01, incorporated herein by reference. The use of a high permittivity oxide material enables the formation of thicker gate insulating layers having approximately the same capacitance (i.e., generating the same electric field given the same potential difference across the layer) as a 5 to 10 angstrom layer of $SiO_2$. For example, a 100 angstrom layer of a high permittivity oxide material having a dielectric constant of 42 has approximately the same capacitance as a 10 angstrom layer of $SiO_2$ (dielectric constant=4.2). Thus, by using a high permittivity material, the electrical properties of the gate insulating tri-layer are retained with an enhanced ability to control the uniformity of the gate insulating layer due to the greater thicknesses involved.

The high permittivity oxide material is typically included in only one layer of the gate insulating tri-layer. The other layers include a nitrogen-containing layer to prevent oxidation of the substrate during subsequent processing and another layer made from an intermediate permittivity oxide material to alter the grain structure within the gate insulating tri-layer and reduce the migration of dopant atoms between the substrate and the gate electrode.

Figure 2A:
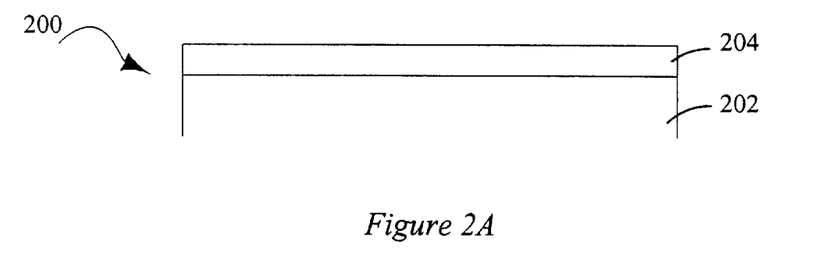
FIGS. 2A through 2F illustrate an exemplary fabrication process in accordance with an embodiment of the invention.

With reference to FIGS. 2A–2F, one exemplary process for forming a semiconductor device 200 having a gate insulating tri-layer made with a high permittivity oxide material will be described. In FIG. 2A, a nitrogen-containing layer 204 is formed on a substrate 202. The substrate 202 may be made of a variety of materials, including, for example, silicon, germanium, or other semiconductor materials. Often the substrate 202 is made of silicon. In addition, the substrate 202 may or may not be doped with a dopant material.

The nitrogen-containing layer 204 typically inhibits oxidation of the underlying substrate 202. For example, in the absence of the nitrogen-containing layer 204, the substrate 202 may oxidize when in contact with intermediate or high permittivity oxide materials during subsequent oxidation and/or annealing processes.

The nitrogen-containing layer 204 may be formed from a number of different materials, including, for examples nitrides, such as silicon nitride or silicon oxynitride. The nitrogen-containing layer may also be formed using a variety of other techniques. These techniques include, for example, deposition of a nitrogen-containing oxide on the substrate 202 or implantation of nitrogen ions followed or preceded by the thermal oxidation of the substrate 202.

Another exemplary method for the formation of the nitrogen-containing layer 204 is the thermal oxidation of the substrate 202 in a nitrogen-bearing ambient. This oxidation may be performed at temperatures ranging from, for example, 700 to 950° C. for a period of, for example, 10 to 60 seconds. The nitrogen-bearing ambient may include $N_2$, $N_2O$, NO, $NH_3$, or a combination of any of these gases and $O_2$. These gases are typically provided at atmospheric pressure, but may range, for example, from 100 millitorr to 3 atmospheres. Often, the nitrogen-containing layer 204 is formed with a relatively small thickness. The thickness of the nitrogen-containing layer 204 may range, for example, from 5 to 10 angstroms, although thicker or thinner layers may also be used. The particular methods of forming the nitrogen-containing layer 204, discussed above, typically result in the formation of a nitrogen-containing oxide layer. Yet another exemplary method for forming the nitrogen-containing layer 204 includes ion implantation and is described in connection with the embodiment depicted in FIGS. 5A–5H.

Figure 2B:
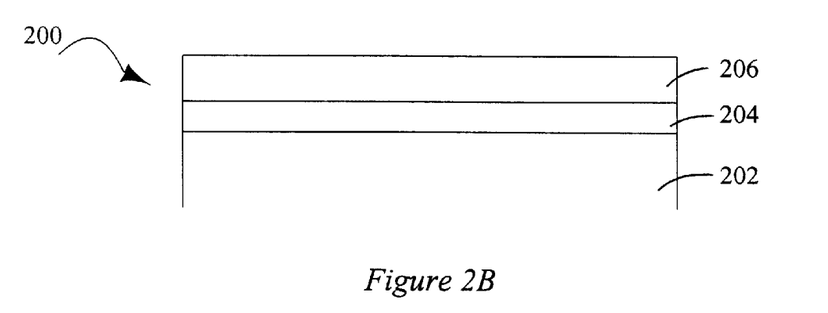

An intermediate permittivity oxide layer 206 is formed over the nitrogen-containing layer 204. The intermediate permittivity oxide layer 206 may be formed using a variety of different materials which have a dielectric constant ranging from 4 to 100. Examples of suitable materials and their approximate dielectric constants include, for example, $TiO_2$ (dielectric constant of 86), lead lanthanum zirconate titanate (PLZT, dielectric constant of 29), and other metal oxides. In some embodiments, the material of the intermediate permittivity oxide layer 206 has a dielectric constant ranging from 10 to 100.

The intermediate permittivity oxide layer 206 may be formed by a variety of well-known techniques including, for example, chemical vapor deposition (CVD), physical vapor deposition, sputtering, and the thermal oxidation of a previously formed metal layer. The particular choice of formation technique may depend on the particular material which is used.

The intermediate permittivity oxide layer 206 may be formed having a thickness which, for example, gives the layer a capacitance equivalent to a 3 to 5 angstrom $SiO_2$ layer. For an intermediate permittivity oxide layer having a dielectric constant of 4, this corresponds roughly to a 3 to 5 angstrom layer and for an intermediate permittivity oxide layer having a dielectric constant of 100, this corresponds roughly to a thickness of 75 to 125 angstrom.

Figure 2C:
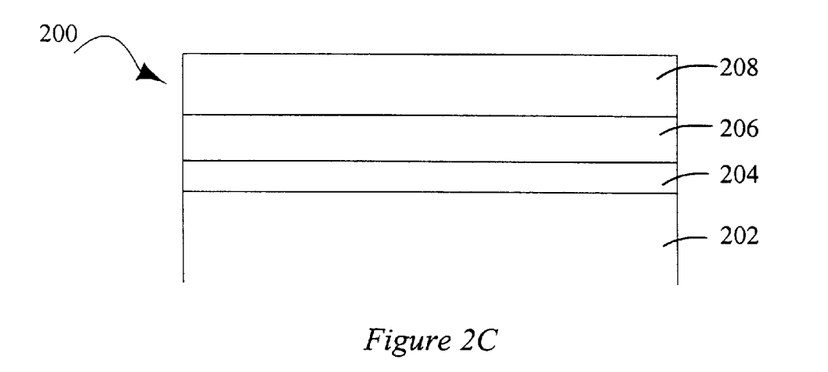

A high permittivity oxide layer 208 is formed over the intermediate permittivity oxide layer 206, as shown in FIG. 2C. The high permittivity layer 208 may have a dielectric constant ranging from about 6 to 10,000, for example. The high permittivity oxide layer 208 could be one of a number of different oxides, including, for example, a barium strontium titanate $Ba_{1-x}Sr_xTiO_3$ (BST, dielectric constant of 20 to 200), tantalum oxide $Ta_xO_y$ (dielectric constant of 20 to 200), lead zirconate titanate (PZT, dielectric constant of 150 to 600), lead zinc niobate $Pb(Zn_{1/3}Nb_{2/3})O_3$ (PZN, dielectric constant of about 7,333), lead scandium tantalate $Pb(Sc_{1/2}Ta_{1/2})$ (PST, dielectric constant of about 3,000) or manganese oxide $MnO_2$ (dielectric constant of about 10,000). In some embodiments, the material of the high permittivity oxide layer 208 has a dielectric constant ranging from 20 to 200.

Formation of the high permittivity oxide layer 208 may, for example, be carried out using known deposition techniques including, for example, chemical vapor deposition (CVD), physical vapor deposition, sputtering, and the thermal oxidation of a previously formed metal layer. The particular type of deposition technique may vary with the type of high permittivity oxide layer 208 used. BST may, for example, be deposited at 700° C. using, for example, chemical vapor deposition, jet vapor deposition, or RF sputtering. Tantalum oxide may, for example, be formed by thermal oxidation of a tantalum film, reactive sputtering, or CVD deposition.

The thickness of the high permittivity oxide layer 208 is selected in consideration of the desired properties of the gate insulating layer 214 as well as reliability concerns. The thickness of the high permittivity oxide layer 208 may, for example, provide a capacitance equivalent to a 2 to 5 angstrom $SiO_2$ layer. For example, the thickness of layer 208 may range from about 20 to 50 angstroms for a high permittivity oxide having a dielectric constant of 40 and about 200 to 500 angstroms for a high permittivity oxide having a dielectric constant of 400.

In some embodiments, the choice of the high permittivity oxide material and the intermediate permittivity oxide material is selected in consideration of the grain structures of the two materials. In particular, the two materials are chosen, in these embodiments, to have different grain structures. This is done to reduce the migration of dopants (such as those used to dope the gate electrode) between the gate electrode 212 (see FIG. 2E) and the substrate 202. If the grain material of all three layers 204, 206, 208 is the same, then there may be a "pipeline" between the gate electrode 212 and the substrate 202. By including layers with different grain structures, it is increasingly unlikely that such "pipelines" will be formed. The grain structure of the two materials may be affected by a variety of conditions including, for example, the crystal structure and lattice parameters of the particular oxide material, the method by which the layer is formed (e.g., CVD or sputtering), and other physical parameters of the formation process, such as temperature, pressure, and concentration of the reactions.

One example of a pair of materials that have different grain structures is titanium dioxide, an intermediate permittivity oxide material, and barium strontium titanate, a high permittivity oxide material. These two materials have different grain structures and/or structure parameters which may, in part, be due to different deposition techniques and annealing temperatures.

While the combined thickness of the tri-layer stack 204, 206, 208 which forms the gate insulating layer 214 (see FIG. 2E) is substantially greater than present $SiO_2$ gate oxide thicknesses, it should be appreciated that the equivalent $SiO_2$ thickness (based on the capacitance of the tri-layer) of the gate insulating layer 214 can be lower than conventional gate oxides. It is this relatively large actual thickness that allows improved reliability in layer formation.

Optionally, the high permittivity oxide layer 208 may be annealed in a nitrogen bearing ambient to incorporate nitrogen 204 in the high permittivity oxide layer 208. This, however, is not a necessary aspect of the invention. The nitrogen bearing ambient may include one or more nitrogen bearing species, such as NO, $NH_3$, or $N_2$, for example. The nitrogen anneal may be useful, for example, when the gate electrode 212 is formed using nitrogen-doped polysilicon. The nitrogen anneal may reduce the migration of dopant species from the gate electrode 212 into the gate insulating tri-layer 214 (see FIG. 2F).

Figure 2D:
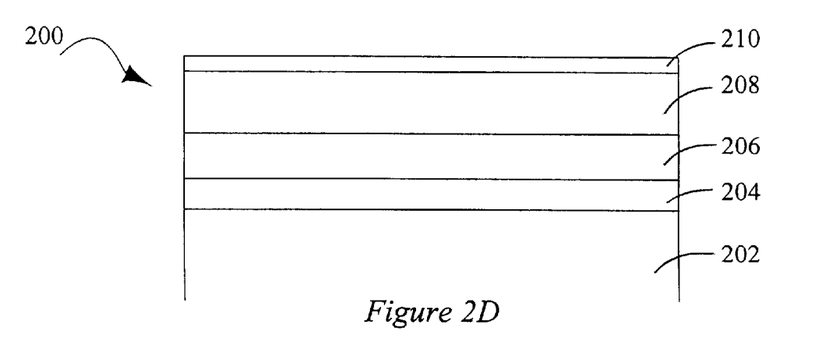

Next, a gate electrode layer 210 is formed over the high permittivity oxide layer 208. The resultant structure is illustrated in FIG. 2D. The gate electrode layer 210 may be formed by, for example, depositing polysilicon or a metal (e.g., aluminum, tungsten, or copper) using known techniques. The thickness of the gate electrode layer is selected in consideration of the desired thickness of the gate electrode/gate insulating layer. Exemplary polysilicon thicknesses can range from about 200 to 3000 Å, while metal thickness are generally somewhat less. While the present invention generally provides a much thicker gate insulating layer than conventional techniques, the use of a thinner gate electrode layer can provide comparable gate electrode/gate insulating layer thicknesses, if desired.

Figure 2E:
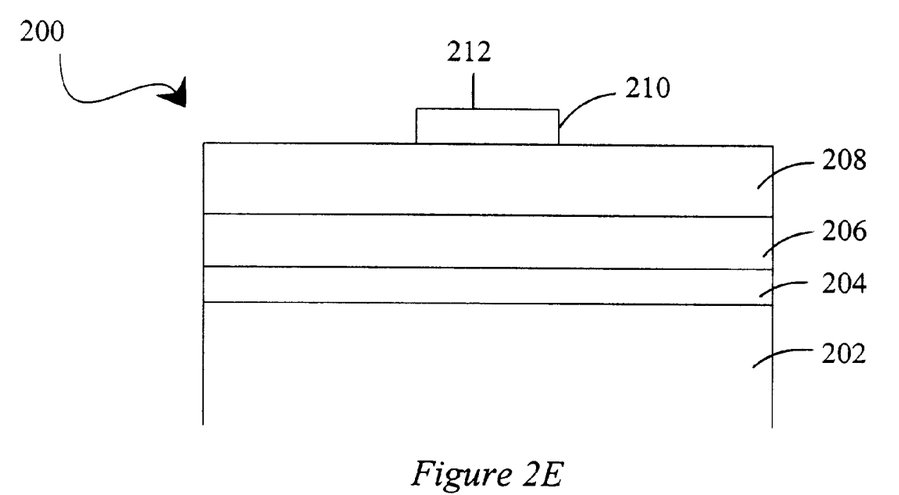

Portions of the gate electrode layer 210 are selectively removed to form gate electrodes 212 (only one of which is shown), as illustrated in FIG. 2E. Removal of the portions of the gate electrode layer 210 may be performed using, for example, known etching techniques.

Figure 2F:
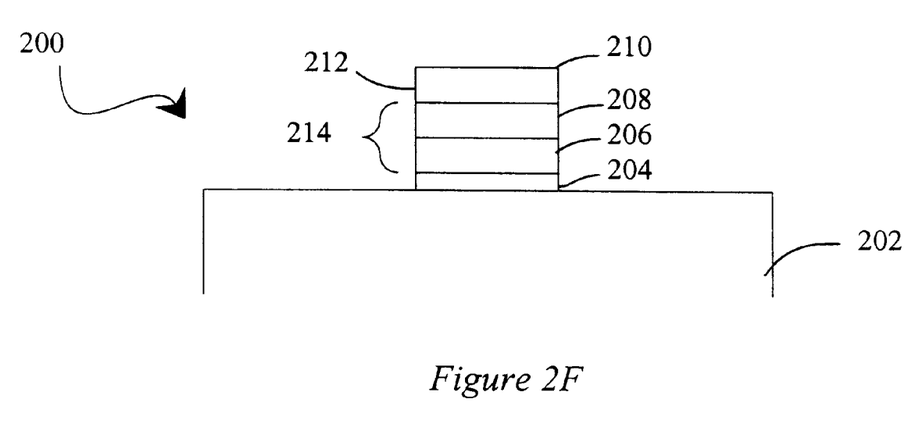

The formation of the gate electrode 212 may also include the removal of portions of the gate insulating layer 214 from active regions of the substrate 202 adjacent the gate electrode 212. Alternatively, the portions of the gate insulating layer 214 adjacent to the gate electrode 210 may be removed in a separate process step, as shown in FIG. 2F. Removal of these portions of the gate insulating layer 214 may, for example, be performed using known etching techniques. Fabrication may continue with well-known processes, such as spacer formation, source/drain implants, silicidation, and contact formation to form the final device structure.

Using a high permittivity oxide material to form a gate insulating layer of a semiconductor device has a number of advantages. As noted above, the equivalent $SiO_2$ thickness of the gate insulating layer can be smaller as compared to gate oxides formed using conventional techniques. For example, high permittivity gate insulating layers having thicknesses equivalent to 5 to 10 Å or less of silicon dioxide, can be formed. The scaled thickness of the gate insulating layer enhances device performance by, for example, increasing drive current of the device. Moreover, due to the greater actual thickness of the gate insulating layer involved, the above process allows the uniformity of the gate insulating layer to be controlled with greater precision than $SiO_2$ gate oxides formed using conventional techniques.

As described above, using high permittivity material to form a gate insulating layer provides improved performance and reliability. FIGS. 3A through 3G illustrate another fabrication process in accordance with an embodiment of the invention in which the order of the formation of the intermediate permittivity oxide layer and the high permittivity oxide layer are reversed. The methods, techniques, and materials for forming the layers and other structures are the same as in the embodiment illustrated in FIGS. 2A–2G, except as indicated below.

Figure 3A:
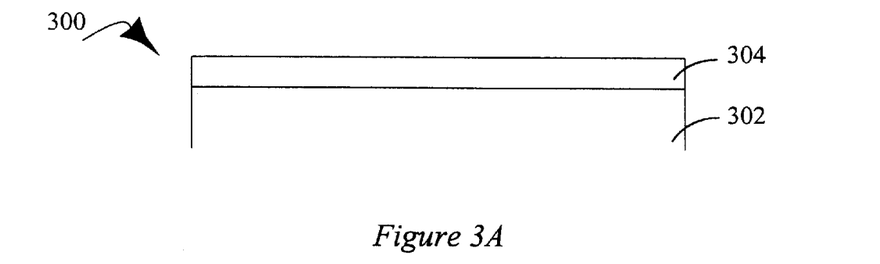
FIGS. 3A through 3F illustrate another exemplary fabrication process in accordance with an embodiment of the invention.
Figure 3B:
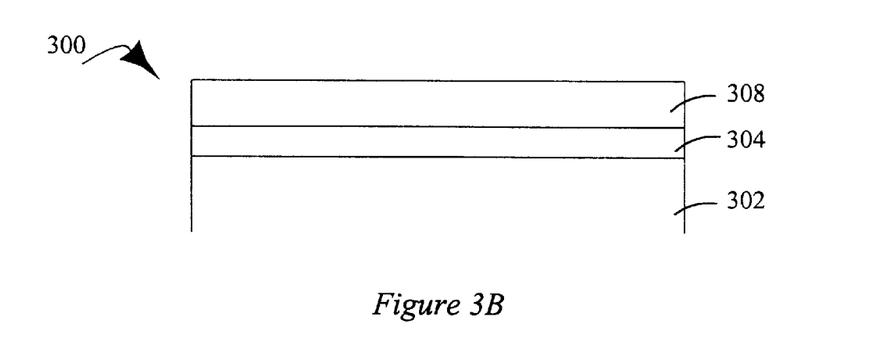

A nitrogen-containing layer 304 is formed on a substrate 302 of a semiconductor device 300, as depicted in FIG. 3A. A high permittivity oxide layer 308 is formed over the nitrogen-containing layer 304, as shown in FIG. 3B. The high permittivity oxide layer 308 may have a thickness so that the capacitance of the layer 308 is equivalent to, for example, a 2 to 5 angstrom $SiO_2$ layer. However, both thicker and thinner layers may be used.

Figure 3C:
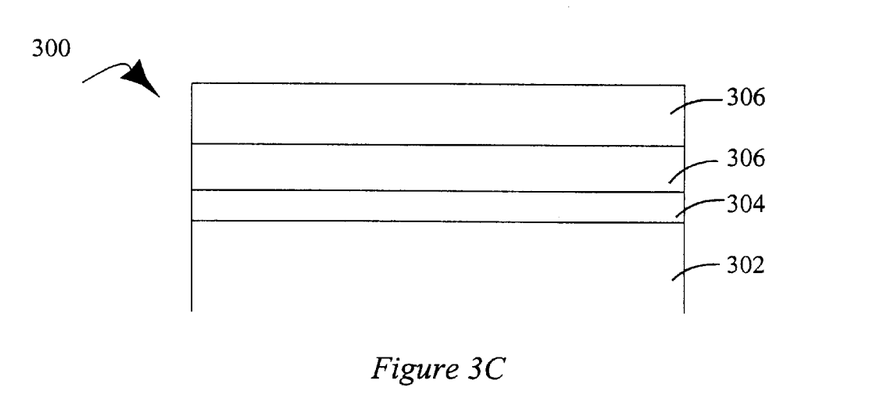

An intermediate permittivity oxide layer 306 is formed over the high permittivity oxide layer 308, as illustrated in FIG. 3C. The intermediate permittivity layer 306 may have a thickness so that the capacitance of the layer 306 is equivalent to, for example, a 3 to 5 angstrom $SiO_2$ layer. However, both thicker and thinner layers may be used. The nitrogen-containing layer 304, high permittivity oxide layer 308, and intermediate permittivity oxide layer 306 form a gate insulating tri-layer 314.

Figure 3D:
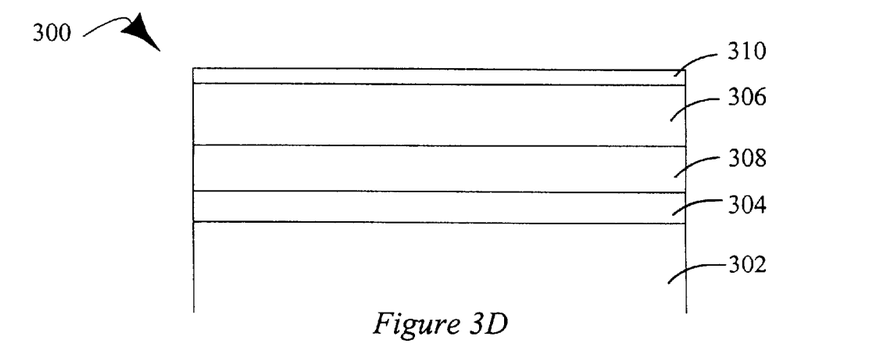
Figure 3E:
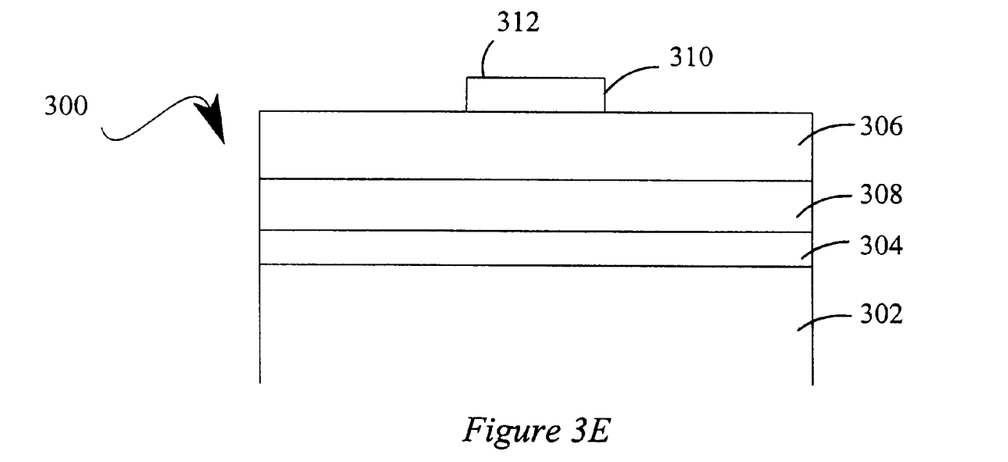
Figure 3F:
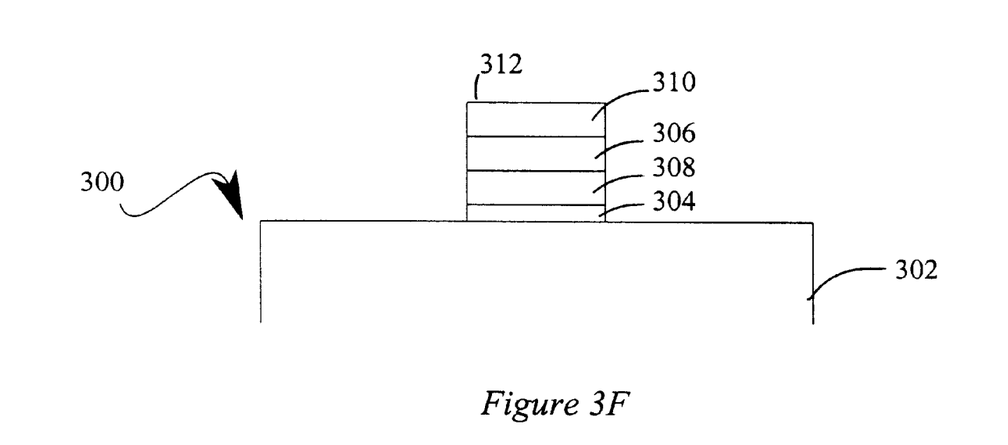

A gate electrode layer 310 is formed over the intermediate permittivity layer 306, as shown in FIG. 3D. A gate electrode 312 may be formed from the gate electrode layer 310 by removal of a portion of the gate electrode layer 310, as illustrated in FIG. 3E. Portions of the gate insulating tri-layer 314 which are adjacent to the gate electrode 312 and over the active regions in the substrate 302 are removed, as shown in FIG. 3F, either subsequent to or simultaneously with the portions of the gate electrode 312.

In general, the intermediate permittivity oxide layer 206, 306 and the high permittivity oxide layer 208, 308 may be formed in either order. However, processing constraints on the particular materials may dictate or suggest a desired order. For example, if one material must be deposited at a particular temperature and the second material is not compatible with processing at that temperature, then the second material should be formed later.

Figure 4A:
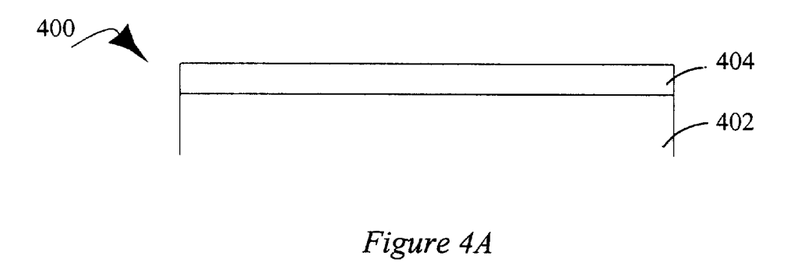
FIGS. 4A through 4D illustrate a third exemplary fabrication process in accordance with an embodiment of the invention.
Figure 4B:
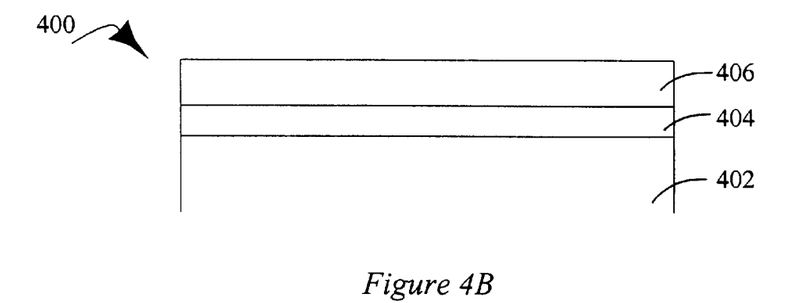
Figure 4C:
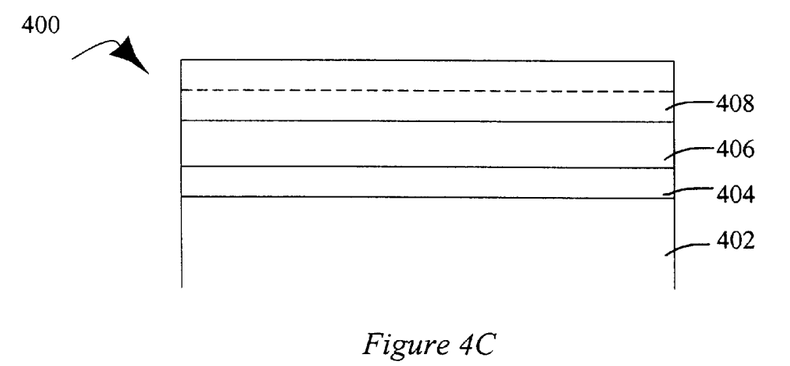

Referring now to FIGS. 4A through 4D, another exemplary fabrication process is illustrated in which the high permittivity oxide layer is planarized prior to formation of the gate electrode. The rest of the processing conditions, materials, and techniques are similar to those used in the embodiment illustrated in FIGS. 2A–2F, except as indicated below. In this embodiment, a nitrogen-containing layer 404 is formed on a semiconductor substrate 402, as shown in FIG. 4A. An intermediate permittivity oxide layer 406 is formed over the nitrogen-containing layer 404, as depicted in FIG. 4B. This is followed by the formation of the high permittivity oxide layer 408 over the intermediate permittivity oxide layer 406, as shown in FIG. 4C.

After formation of the high permittivity oxide layer 408, a portion of the layer 408 is removed to form a relatively planar surface, as indicated by the dotted line in FIG. 4C. The portion of layer 408 may be removed by a variety of well-known techniques, including chemical polishing, mechanical polishing, and chemical-mechanical polishing (CMP). The high permittivity oxide layer 408 is typically initially formed as a thicker layer, as compared to the other embodiments described above, to account for the removal of material to planarize the surface of the layer 408. Typically, the initial thickness of the high permittivity layer 408 is such that after the surface planarization, the thickness of the layer 408 provides, for example, a capacitance equivalent to that of a 2 to 5 angstrom $SiO_2$ layer. For example, the high permittivity oxide layer 408 may be 500 to 2000 angstroms thicker than the high permittivity oxide layer 208. The additional thickness is typically removed prior to formation of the gate electrode layer 410.

Figure 4D:
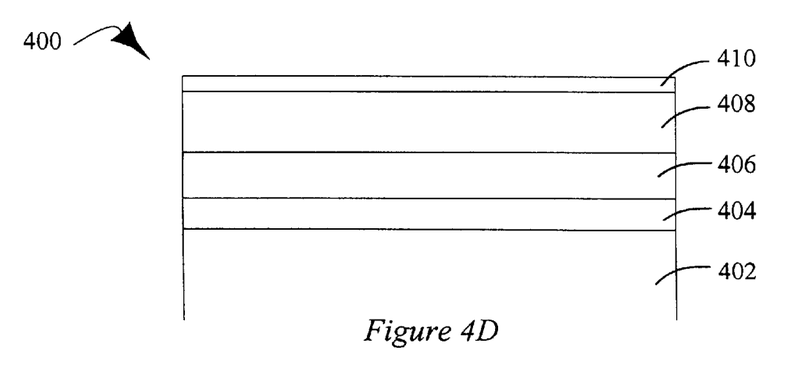

Following the removal of the portion of the high permittivity oxide layer 408 to planarize the surface of the layer 408, a gate electrode layer 410 is formed over the layer 408, as shown in FIG. 4D. The process then continues in the same manner as depicted in FIGS. 2E and 2F.

It will be understood that the same planarization process can also be used in conjunction with the embodiment illustrated in FIGS. 3A to 3F. In that case, it is a portion of the intermediate permittivity oxide layer 306 which is removed to planarize the surface of that layer prior to the formation of the gate electrode layer 310. The initial thickness of the intermediate permittivity oxide layer 306 may be increased accordingly to account for the removal of a portion of that layer.

Another embodiment is illustrated in FIGS. 5A–5H. In this embodiment, the gate electrode is polished into a masking layer. The process begins with the formation of a nitrogen-containing layer 504 in a substrate 502. The previously described methods of forming the nitrogen-containing layer 504 may be used, including, for example, deposition of a nitrogen-containing oxide on the substrate 502, implantation of nitrogen ions which may be followed or preceded by the thermal oxidation of the substrate 502, or thermal oxidation of the substrate 502 in a nitrogen-bearing ambient.

Figure 5A:
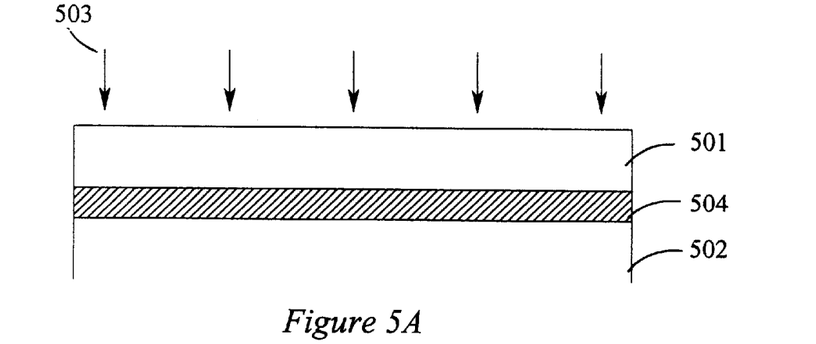
FIGS. 5A through 5H illustrate a fourth exemplary fabrication process in accordance with an embodiment of the invention.
Figure 5B:
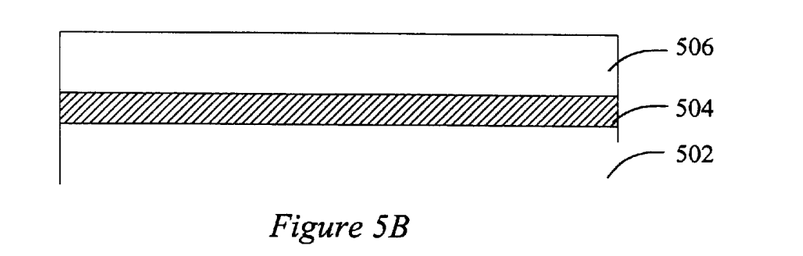
Figure 5C:
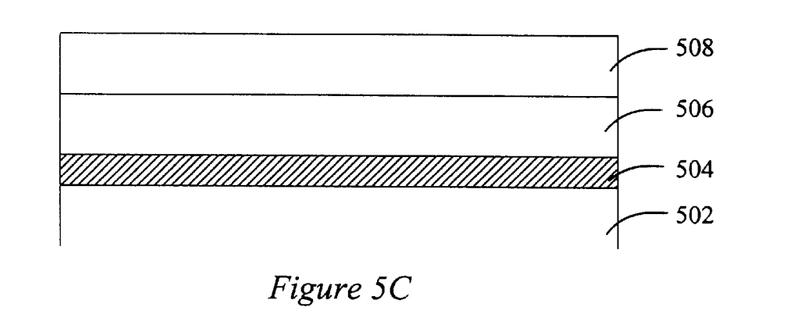

In the illustrated embodiment, the nitrogen-containing layer 504 is formed by implanting a nitrogen species, such as nitrogen ions, as illustrated in FIG. 5A. In this embodiment, an oxide layer 501 having a thickness of, for example, about 50 to 100 angstroms is formed on the substrate 502. This oxide layer may be formed by a variety of well-known techniques, including, for example, thermal oxidation of the substrate 502. The nitrogen species 503 is then implanted through the oxide layer 501 into the substrate 502 to form the nitrogen-containing layer 504. The implantation may be performed using implant energies of, for example, 5 to 50 keV and dopant concentrations of, for example, 5E13 ($5\times10^{13}$) to 5E15 ($5\times10^{15}$) ions/cm$^2$. The oxide may then be removed using well-known techniques, including, for example, etching.

After removing the oxide, an annealing process may also be used to increase the depth and uniformity of the nitrogen doping. Annealing may be performed at temperatures ranging, for example, from 800 to 1000° C. and heating times ranging, for example, from 30 to 60 seconds. This particular nitrogen-containing layer 504 does not contain oxide materials and may have a thickness of as little as 5 angstroms or less. This method for forming the nitrogen-containing layer may also be used in connection with any of the previously described embodiments.

An intermediate permittivity oxide layer 506 (FIG. 5B) and a high permittivity oxide layer 508 (FIG. 5C) are then formed over the nitrogen-containing layer 504 in, for example, a similar manner to that previously described in connection with FIGS. 2A–2F. It will also be understood that the order of the intermediate permittivity oxide layer and the high permittivity oxide layer may be reversed and that a portion of the later-formed layer may be removed to provide a planer surface as described in connection with the embodiments illustrated in FIGS. 3A–3F and 4A–4D, respectively.

Figure 5D:
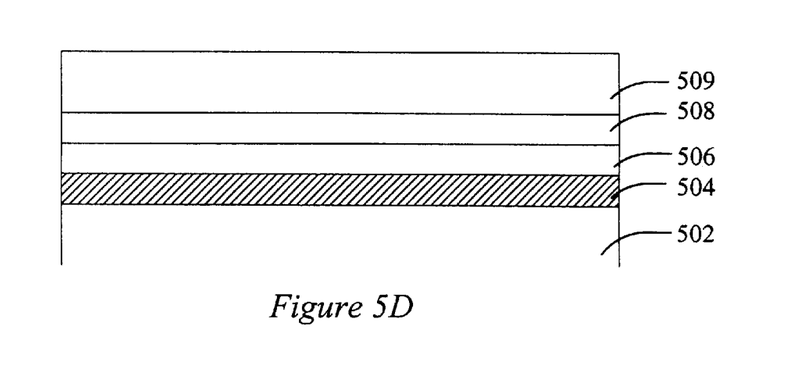

A masking layer 509 is formed over the high permittivity oxide layer 508 (or intermediate permittivity oxide layer if the order of formation is reversed), as shown in FIG. 5D. This masking layer 509 is typically formed using a material which may be selectively removed with respect to the material of a subsequently formed gate electrode. Suitable materials include, for example, an oxide or nitride. The thickness of the masking layer 509 generally corresponds roughly to the desired gate electrode thickness which may, for example, range from 500 to 3000 angstroms.

Optionally, a portion of the masking layer 509 may be removed to form a relatively planar surface of the masking layer 509. The portion may be removed using well-known techniques, including, for example, chemical polishing, mechanical polishing, and chemical-mechanical polishing (CMP). The initial thickness of the masking layer 509 may be selected to account for this removal process.

Figure 5E:
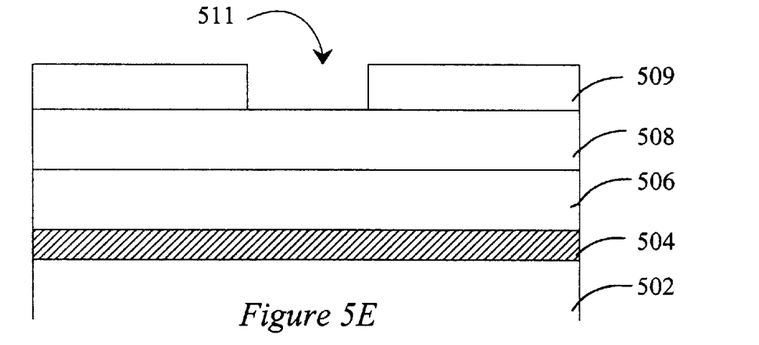

The masking layer 509 is patterned and a portion of the masking layer 509 is removed to form an opening 511, as shown in FIG. 5E. This may be accomplished using, for example, well-known photolithographic techniques.

Figure 5F:
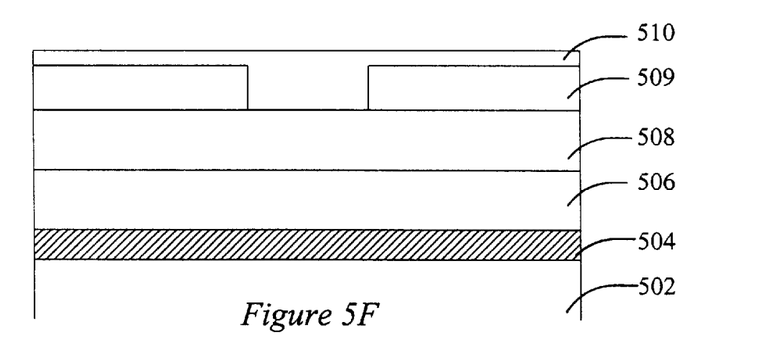

A gate electrode layer 510 is formed over the masking layer 509 and fills the opening 511, as shown in FIG. 5F. The gate electrode layer 510 may be formed using a variety of materials including, for example, polysilicon and metals, such as, for example, aluminum, tungsten, copper, iridium, titanium, and cobalt. The gate electrode layer 510 may be formed using a variety of techniques, including, for example, chemical vapor deposition, physical vapor deposition, and sputtering. The gate electrode layer 510 may be confined to the opening 511 or may be deposited over the masking layer 509, as well as the opening 511.

Figure 5G:
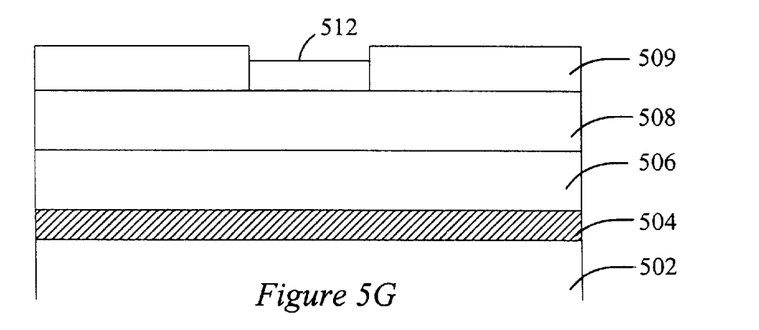
Figure 5H:
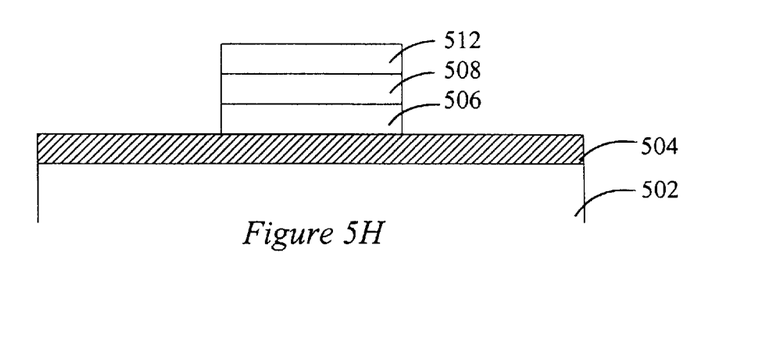

A portion of the gate electrode layer 510 is then removed to leave a gate electrode 512 in the opening 511, as illustrated in FIG. 5G. This removal process can be performed by a variety of techniques, including, for example, chemical polishing, mechanical polishing, and chemical-mechanical polishing (CMP). The gate electrode layer 510 may be planarized with the upper surface of the masking layer 509. Alternatively, the gate electrode layer 510 may be under-polished or overpolished to leave a gate electrode which is extended or recessed, respectively, with respect to the masking layer 509. The thickness of the gate electrode 512 depends on the thickness of the masking layer 509 and whether the gate electrode 512 lies planer with the masking layer 509 or is recessed or extended relative to the masking layer 509. Suitable thicknesses of the gate electrode 512 range from about 500 to 3000 angstroms for many applications.

The masking layer 509 is removed to leave the gate electrode 512. This removal of the masking layer 509 may also include the removal of portions of the high permittivity oxide layer 508 and intermediate permittivity oxide layer 506 from active regions of the substrate 502 adjacent the gate electrode 512. Alternatively, the portions of layers 506, 508 adjacent to the gate electrode 512 may be removed in a separate process step to leave the structure shown in FIG. 5H. Removal of the masking layer 509 and the portions of the layers 506, 508 may, for example, be performed using known etching techniques.

Fabrication may continue with well-known processes, such as spacer formation, source/drain implants, silicidation, and contact formation to form the final device structure. Advantages of the above-described fabrication process include the formation of gate electrode and gate insulating layer which are easily aligned. In addition, the use of a high permittivity oxide material allows for easier control of the formation of a gate insulating layer having a capacitance which is equivalent to the capacitance of a 5 to 10 angstrom or less silicon dioxide layer.

As noted above, the present invention is applicable to fabrication of a number of different devices where the advantages of a high permittivity gate insulating layer are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A semiconductor device, comprising:
   a substrate;
   a nitrogen-containing layer disposed on the substrate;
   a first dielectric layer disposed over the nitrogen containing layer;
   a second dielectric layer disposed over the first dielectric layer; and
   a gate electrode disposed over the second dielectric layer;
   wherein one of the first and second dielectric layers comprises titanium dioxide having a dielectric constant ranging from 4 to 100 and the other of the first and second dielectric layers comprises a second oxide having a higher dielectric constant ranging from 10 to 10,000.

2. The semiconductor device of claim 1, wherein the first dielectric layer comprises the oxide having the dielectric constant ranging from 4 to 100.

3. The semiconductor device of claim 1, wherein the second dielectric layer comprises the oxide having the dielectric constant ranging from 4 to 100.

4. The semiconductor device of claim 1, wherein the first dielectric layer and the second dielectric layer have different grain structures.

5. The semiconductor device of claim 1, the oxide having the higher dielectric constant is barium strontium titanate.

6. The semiconductor device of claim 1, wherein the first oxide has a dielectric constant ranging from 10 to 100.

7. The semiconductor device of claim 1, wherein the combined first and second dielectric layers have a capacitance that is equal to a capacitance of a silicon dioxide layer having a thickness of 5 to 10 angstroms.

8. The semiconductor device of claim 1, wherein each of the first and second dielectric layers has a capacitance that is equal to a capacitance of a silicon dioxide layer having a thickness of 2 to 5 angstroms.

9. The semiconductor device of claim 1, wherein the gate electrode comprises polysilicon.

10. The semiconductor device of claim 1, wherein the gate electrode comprises a metal.

11. The semiconductor device of claim 10, wherein the metal is selected from the group consisting of iridium, titanium, cobalt, or mixtures thereof.

12. The semiconductor device of claim 1, wherein the nitrogen containing layer has a thickness ranging from 5 to 10 angstroms.

13. The semiconductor device of claim 1, wherein the second oxide has a dielectric constant of at least 40.

14. The semiconductor device of claim 1, wherein the nitrogen-containing layer comprises a nitrogen-containing compound selected from the group consisting of silicon nitride and silicon oxynitride.

15. The semiconductor device of claim 1, wherein the second oxide comprises an oxide selected from the group consisting of barium strontium titanate tantalum oxide, lead zirconate titanate, lead zinc niobate, lead scandium tantalate, and manganese oxide.

16. The semiconductor device of claim 1, wherein the nitrogen containing layer has a thickness ranging from 50–100 angstroms.

17. A semiconductor device, comprising:

a substrate;

a nitrogen-containing layer disposed on the substrate;

a titanium dioxide layer disposed over the nitrogen containing layer;

a barium strontium titanate layer disposed over the titanium dioxide layer; and a gate electrode disposed on the barium strontium titanate layer.

18. A semiconductor device, comprising:

a substrate;

a nitrogen-containing layer disposed on the substrate;

a first dielectric layer disposed over the nitrogen containing layer;

a second dielectric layer disposed over the first dielectric layer; and a gate electrode disposed over the second dielectric layer;

wherein one of the first and second dielectric layers comprises a first oxide having a dielectric constant ranging from 4 to 100 and a thickness ranging from 3 to 125 angstroms and the other of the first and second dielectric layers comprises a second oxide having a higher dielectric constant ranging from 10 to 10,000 and a thickness ranging from 20 to 500 angstroms.

19. The semiconductor device of claim 18, wherein the one of the first and second dielectric layers that comprises the first oxide has a thickness ranging from 5 to 125 angstroms.

20. The semiconductor device of claim 18, wherein the other of the first and second dielectric layers that comprises the second oxide has a thickness ranging from 50 to 500 angstroms.

21. A semiconductor device, comprising:

a substrate;

a nitrogen-containing layer having a thickness of 5 to 10 angstroms disposed on the substrate;

a first dielectric layer disposed over the nitrogen containing layer;

a second dielectric layer disposed over the first dielectric layer; and a gate electrode disposed over the second dielectric layer;

wherein one of the first and second dielectric layers comprises a first oxide having a dielectric constant ranging from 4 to 100 and the other of the first and second dielectric layers comprises a second oxide having a higher dielectric constant ranging from 10 to 10,000.

22. The semiconductor device of claim 1, wherein the second oxide has a dielectric constant ranging from 20 to 200.

* * * * *

UNITED STATES PATENT AND TRADEMARK OFFICE
CERTIFICATE OF CORRECTION

PATENT NO.     : 6,057,584
DATED          : May 2, 2000
INVENTOR(S)    : Gardner et al.

It is certified that error appears in the above-identified patent and that said Letters Patent is hereby corrected as shown below:

<u>Drawings,</u>
FIG. 3C, the second (directly above 304) "306" should read -- 308 --.

<u>Column 11,</u>
Line 5, "barium strontium titanate" should read -- barium strontium titanate, --.

Signed and Sealed this

Twenty-fifth Day of March, 2003

JAMES E. ROGAN
*Director of the United States Patent and Trademark Office*